(12) United States Patent
Jang

(10) Patent No.: US 7,326,978 B2
(45) Date of Patent: Feb. 5, 2008

(54) COLOR FILTER OF IMAGE SENSOR, IMAGE SENSOR, AND METHOD FOR MANUFACTURING THE IMAGE SENSOR

(75) Inventor: James Jang, Cheongju-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 513 days.

(21) Appl. No.: 10/747,40 5

(22) Filed: Dec. 30, 2003

(65) Prior Publication Data

US 2005/0067668 A1    Mar. 31, 2005

(30) Foreign Application Priority Data

Sep. 30, 2003  (KR) .................... 10-2003-0067983

(51) Int. Cl.
*H01L 31/062* (2006.01)
*H01L 31/113* (2006.01)
*H01L 31/0232* (2006.01)

(52) U.S. Cl. ...................... 257/292; 257/432

(58) Field of Classification Search ........ 257/291–294, 257/431–448
See application file for complete search history.

(56) References Cited

U.S. PATENT DOCUMENTS

| | | | | |
|---|---|---|---|---|
| 5,440,343 A | * | 8/1995 | Parulski et al. | ............. 348/316 |
| 6,529,239 B1 | * | 3/2003 | Dyck et al. | ................. 348/279 |
| 6,800,838 B2 | * | 10/2004 | Yamamoto | ............. 250/214 R |

* cited by examiner

*Primary Examiner*—Cuong Nguyen
(74) *Attorney, Agent, or Firm*—Finnegan, Henderson, Farabow, Garrett & Dunner L.L.P.

(57) ABSTRACT

A color filter of an image sensor, an image sensor and a method for manufacturing the image sensor are disclosed, wherein shapes of respective unit color cells closely form various color patterns, such as a red color pattern, a green color pattern and a blue color pattern, within each unit color cell in a stripe type, and various colors such as red, green and blue required for image generation are produced, without interdependence of the respective unit color cells, are normally realized to induce a finished color filter array to smoothly express more colors, so that the resolution of a generated image in an optimal state is achieved.

12 Claims, 6 Drawing Sheets

COLOR FILTER OF IMAGE SENSOR, IMAGE SENSOR, AND METHOD FOR MANUFACTURING THE IMAGE SENSOR

This application is based on and clams the priority to Korean Patent Application No. 10-2003-0067983, filed on Sep. 30, 2003, the entire contents of which are incorporated herein by reference.

BACKGROUND OF THE INVENTION

1. Field of the Invention

The present invention generally relates to image sensors, and particularly to a color filter of an image sensor, capable of improving shapes of respective unit color cells to closely form various color patterns (such as, a red color pattern, a green color pattern and a blue color pattern) within each unit color cell in a stripe type, thereby normally realizing various colors (such as, red, green and blue) required for image generation by itself without interdependence of the respective unit color cells, so that it is possible to induce a finally finished color filter array to smoothly express more colors within a given condition. Further, the present invention relates to an image sensor using such a color filter and a method for manufacturing an image sensor.

2. Description of the Related Art

Recently, with a rapid development of the electric/electronic technologies, various electronics, such as video cameras, digital still cameras, minicams adapted to personal computers (PC), minicams adapted to mobile phones and so forth, employing image sensor technologies have been widely developed and used.

Traditionally, charge coupled devices (CCDs) have been used in conventional image sensors. However, CCDs can involve drawbacks which may include high driving voltages, separate additional support circuits, and high per-unit prices. As a result, their usage in imaging sensors recently has been declining.

Recently, attention has turned to Complementary Metal Oxide Semiconductor (CMOS) image sensors for overcoming the disadvantages of the CCD. Since CMOS image sensors are manufactured based on CMOS circuit technologies, contrary to existing CCDs, they may have advantages including low driving voltage, lack of additional support circuits, low per-unit price, etc.

As shown in FIG. 1, a CMOS image sensor 10 according to the conventional art for realizing a color image may be constructed in the following manner. Photosensitive pixel units 30 may be combined with a color filter array CA, wherein the photosensitive pixel units 30 may be disposed on a semiconductor substrate 40 and receive light L to generate and accumulate photocharges, and the color filter array CA may force the received light L to be colorized and transmitted to the photosensitive pixel units 30. In this case, in order to transmit light L to the photosensitive pixel units 30 through the color filter array CA, an intermediate layer 20 is interposed between the photosensitive pixel units 30 and the color filter array CA.

Here, as shown in the FIG. 1, the color filter array CA may be combined by a plurality of unit color cells C1, C2, and C3, which may be associated with various colors, such as red, green and blue (in FIG. 1, for the sake of convenience, only four unit color cells are shown). Each of the unit color cells C1, C2 and C3 may be arranged on the top of the intermediate layer 20 in a mosaic type.

Various processes may be performed in conjunction with the use of CMOS image sensor 10. For example, first, the green unit color cell C3, the red unit color cell C1 and the blue unit color cell C2 may colorize light incident L into green, red and blue light, respectively, and then may pass the colorized light to the photosensitive pixel units 30. Subsequently, the respective photosensitive pixel units 30, which may correspond to the green unit color cell C3, the red unit color cell C1 and the blue unit color cell C2, generate photocharges corresponding to the colorized light and then transmit the generated photocharges to signal processing circuits (e.g., interpolation circuits which are not shown). The interpolation circuits then may interpolate the colors of green, red and blue in a proper manner to generate an image having a predefined resolution.

Human visual perception is generally more sensitive to green than the other primary colors. For this reason, CMOS image sensor 10 may be fabricated so that the green unit color cell C3 occurs with greater frequency compared with the red and blue unit color cells C1 and C2, respectively.

With systems using conventional CMOS image sensor 10, the green unit color cell C3, the red unit color cell C1, and the blue unit color cell C2, all of which may constitute the cell array CA, may display only one color associated with the respective photosensitive pixel 30 (i.e., any one of green, red and blue). Thus, as long as each cell does not depend on a differing adjacent color filter cells, it is impractical to realize a variety of colors associated with any single photosensitive pixel 30.

In other words, with conventional imaging systems, only when the red unit color cell C1 is processed with different unit color cells C2 and C3, is it practical to express a variety of colors required for image generation. However, when the red unit color cell C1 is isolated from different unit color cells C2 and C3, imagery representing only the color red can be produced.

In this manner, images expressing all of the colors associated with respective unit color cells C1, C2 and C3 can be produced. However, the processing produces pixels in the final image which are mutually dependent upon light collected from neighboring unit color cells. Because of this mutually dependent relationship, the production of images by photosensitive pixel units 30 can be inefficient. As a result, a final resolution of the image obtained by the image sensor 10 may be greatly reduced over the total number of arranged unit color cells C1, C2 and C3.

That is to say, with conventional systems, even though relatively many unit color cells C1, C2 and C3 are provided, it is impractical for CMOS image sensor 10 to normally obtain a high resolution image which is proportional to the total number of arranged unit color cells.

Obtaining higher resolution images using conventional CMOS sensor 10 would typically entail increasing the number of unit color cells C1, C2, and C3, unless other measures are taken. Consequently, CMOS image sensor 10 may encounter various problems, such as an increased price, increase in size, etc.

Furthermore, in situations where the corresponding image requires a more precise color pattern, the conventional techniques as described above may not be sufficient.

Moreover, conventional CMOS image sensor 10 may be constructed in a manner so that the respective unit color cells C1, C2 and C3 are arranged on the top of intermediate layer 20 in a mosaic type without a separate reinforcement. In this case, when processes for forming additional unit color cells are undertaken without taking separate measures, such as, for example, a process for laminating photoresist, a process for patterning photoresist, etc., the unit color cells C1, C2 and C3 formed previously may be peeled off from the intermediate layer by an impact applied during construction, i.e., the unit color cells may experience peeling phenomena. As a result, the finished color filter array CA takes an abnormal form in which some unit color cells may be sparsely omitted. In this case, it is impractical for the final finished CMOS image sensor 10 to generate a normal image.

Of course, when reinforcements are additionally arranged between the respective unit color cells C1, C2 and C3, the peeling phenomenon of the unit color cells may be prevented to a certain extent, but because the color filter array CA is generally formed on a very small scale, it is almost impossible to additionally provide separate reinforcements between the respective unit color cells C1, C2 and C3 using present process standards. Therefore, the foregoing peeling phenomenon is recognized as a serious shortcoming in the field of known CMOS image sensor fabrication.

SUMMARY OF THE INVENTION

Accordingly, embodiments consistent with the present invention are provided to address the above-mentioned shortcomings. One aspect consistent with an embodiment of the present invention is to improve shapes of respective unit color cells to closely form various color patterns, such as a red color pattern, a green color pattern and a blue color pattern, within each unit color cell in a stripe type, thereby to normally realize various colors such as red, green and blue required for image generation by itself without interdependence of the respective unit color cells, to induce a finally finished color filter array to smoothly express more colors within a given condition, thereby maintaining resolution of a finally generated image in an optical state.

Another aspect consistent with another embodiment of the present invention is to closely form a plurality of color patterns, such as a red color pattern, a green color pattern and a blue color pattern, which maximize a contact length (or area) of each interface within each unit color cell in an optimal state, in a proper type, for example in a stripe type, and to allow the color patterns to continuously maintain an interdependently fixed structure within the respective unit color cells, thereby producing a finally finished color filter array which avoids undesired damage to colors by peeling of effective color patterns after processes for additionally forming subsequent color patterns, such as a process for laminating photoresist, a process for patterning photoresist, etc., are aggressively performed.

In order to accomplish these aspects, according to embodiments of the present invention, a color filter of an image sensor is provided wherein color patterns of red, green and blue are each formed by occupying a predetermined scale of an individual occupation space within one unit color cell.

In this case, the color patterns formed within one unit color cell may be arranged in rows in a stripe type with interfaces between the color patterns (e.g., red color pattern, green color pattern and blue color pattern) brought close contact with each other to be overlapped.

In order to accomplish these aspects, another embodiment of the present invention provides an image sensor comprising: at least one unit color cell for colorizing incidence light into different colors form each other; at least one photosensitive pixel unit disposed on an active region of a semiconductor substrate for selectively sensing and individually outputting photocharges generated by passing through the unit color cell; and an intermediate layer for transmitting the different colors of light passing through the unit color cell to the photosensitive pixel unit.

Here, the respective photosensitive pixel unit comprises a potential well temporarily formed on an active region of the semiconductor substrate in a moment according to an input bias for receiving light passing through the unit color cell to generate and accumulate photocharges; a first photosensitive electrode disposed on the active region for transmitting the light passing through a first region of the unit color cell to generate the photocharges at the potential well; a second photosensitive electrode disposed on the active region for transmitting the light passing through a second region of the unit color cell to generate the photocharges at the potential well; and a third photosensitive electrode disposed on the active region for transmitting the light passing through a third region of the unit color cell to generate the photocharges at the potential well.

Further, the second and third photosensitive electrodes are simultaneously driven, and the first photosensitive electrode is driven separately from the second and third photosensitive electrodes.

In addition, in order to accomplish these aspects according to yet another embodiment of the present invention, a method for manufacturing an image sensor is provided comprising: forming an isolating layer in order to define an active region on a semiconductor substrate; depositing a first insulating layer and a first conductive layer on the substrate; patterning the first insulating layer and the first conductive layer to form second and third photosensitive electrodes to be spaced apart from each other; depositing a second insulating layer and a second conductive layer in order to fill a space between the second and third photosensitive electrodes and forming a first photosensitive electrode; forming an intermediate layers on the first, second and third photosensitive electrodes; forming second and third color patterns spaced apart from each other at a predetermined interval on a predetermined region of a unit color cell on the respective pre-defined intermediate layer; and forming a first color pattern in order to fill a space between the second and third color patterns.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Hereinafter, a unit color filter, an image sensor employing the same and a manufacturing method thereof of the present invention will be described in detail with reference to the accompanying drawings.

Figure 1:
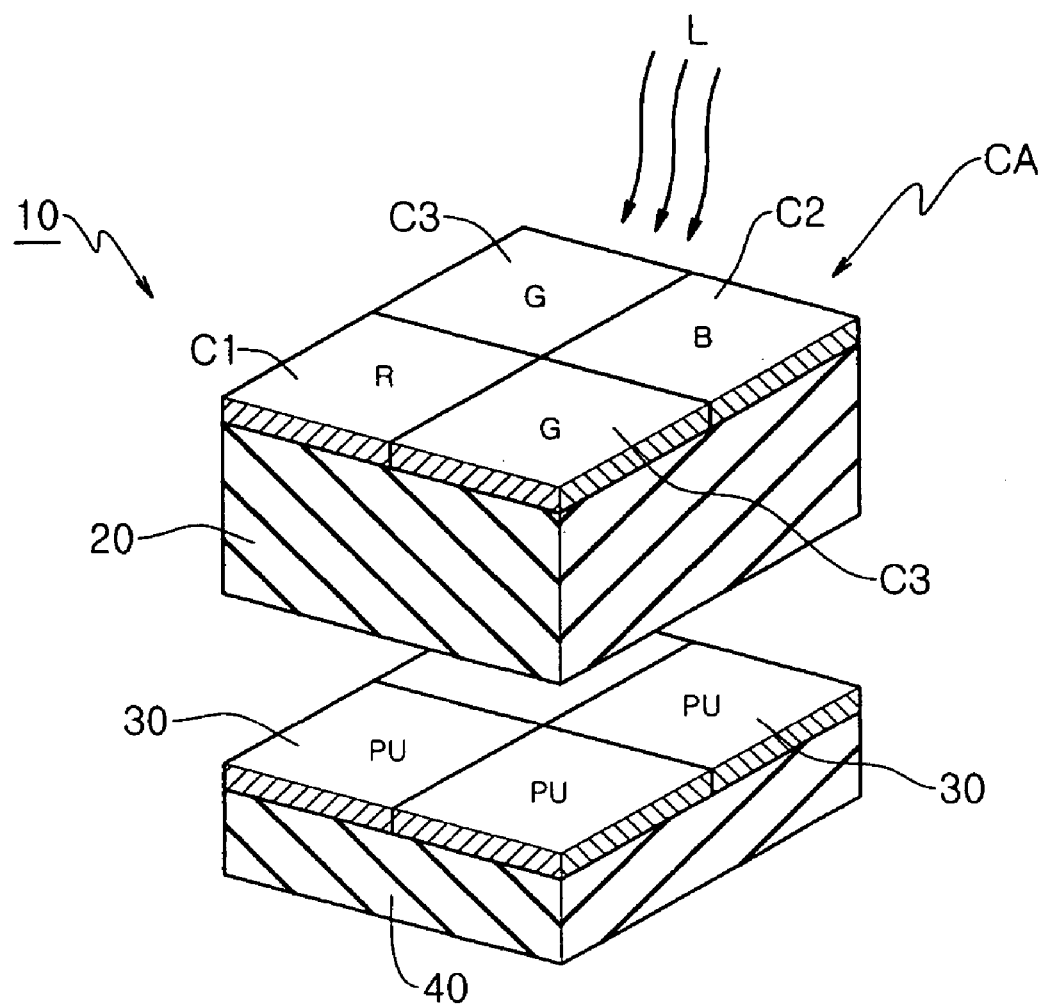
FIG. 1 illustrates a structure of a conventional image sensor.
Figure 2:
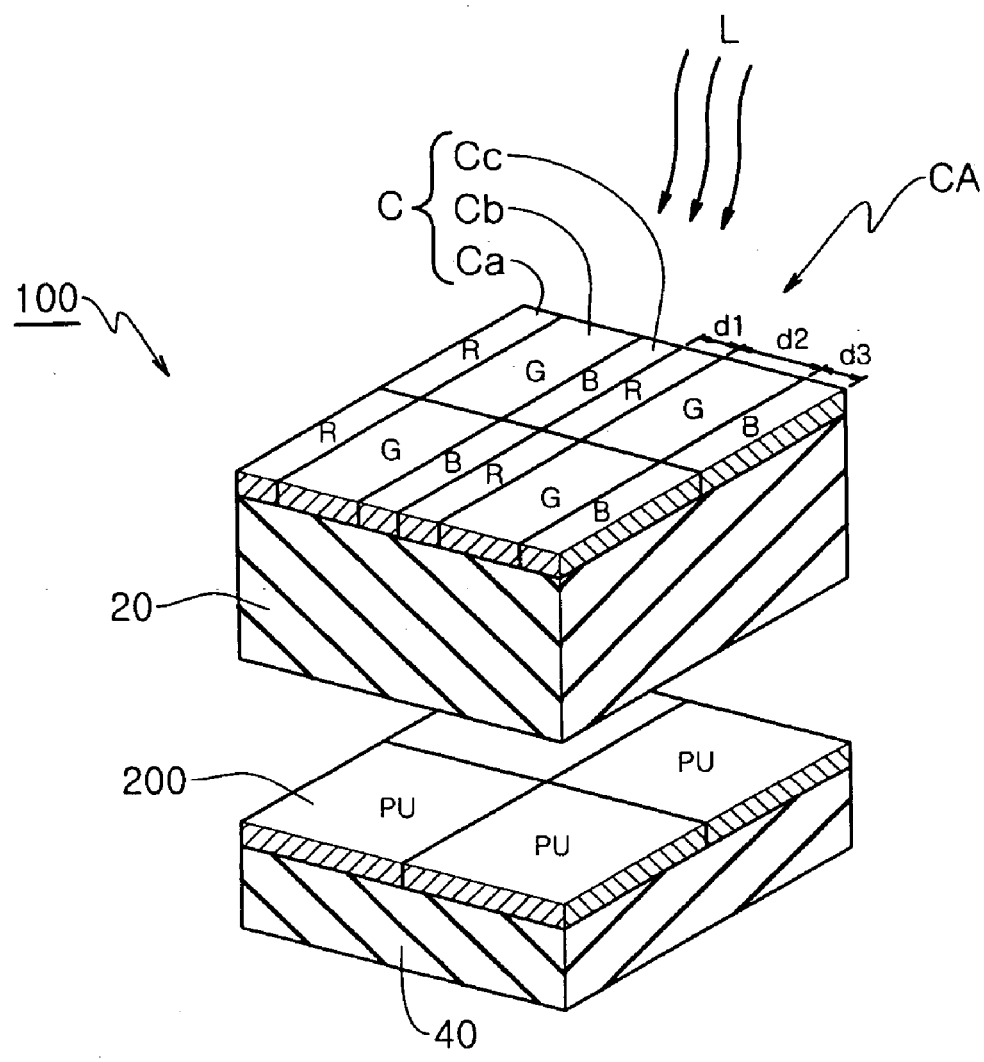
FIG. 2 illustrates a structure of an image sensor consistent with embodiments of the present invention.

As shown in FIG. 2, under an image sensor 100 of an embodiment consistent with the present invention, for example, a CMOS image sensor system, a plurality of unit color cells C may form an array CA of color filters developed in a matrix type on a certain layer, for example, an intermediate layer 20. The intermediate layer 20 may comprise, for example, an interlayer dielectric, an interconnect metal layer, a planarized layer and so forth. Of course, the deposition structure of the intermediate layer 20 may be modified under certain circumstances.

As shown in the drawing, the unit color cell C may have a construction in which a plurality of individual color filters, for example, first, second and third color patterns Cb, Ca and Cc, may be serially and successively disposed in its occupying space. In this case, the first color pattern Cb may display green color, the second color pattern Ca may display red color, and the third color pattern Cc may display blue color.

In the embodiment where the first color pattern Cb serves to transmit incident light L and colorize corresponding incident light into, for example, green color. The second color pattern Ca serves to transmit incident light L and colorize corresponding incident light into red color. The third color pattern Cc serves to transmit incident light L and colorized corresponding incident light into blue color.

Since human visual perception is generally more sensitive to green color, the color patterns may be constructed so that a size d2 of the first color pattern Cb may be greater than a size d1 of the second color pattern Ca or a size d3 of the third color pattern Cc. In this embodiment, an occupying area of green color may be enlarged naturally in comparison to those of the red and blue colors.

As described above, in the known art, the respective unit color cells constituting the cell array merely displayed only one color, such as, green, red, blue, etc., so unless pixels rely on adjacent unit color cell with other color cells, a variety of colors may not be realized.

However, in an embodiment consistent with the present invention, since the respective unit color cells C has the first, second and third color patterns Cb, Ca and Cc which may be capable of realizing various colors. In this embodiment, the respective unit color cells C may solely realize various colors required for image production, for example, green, red or blue, without relying on other color cells. As a result, when the present embodiment is realized, a finished color filter array CA can naturally display many colors under given condition, so that resolution of the image produced finally becomes optimized.

Figure 3:
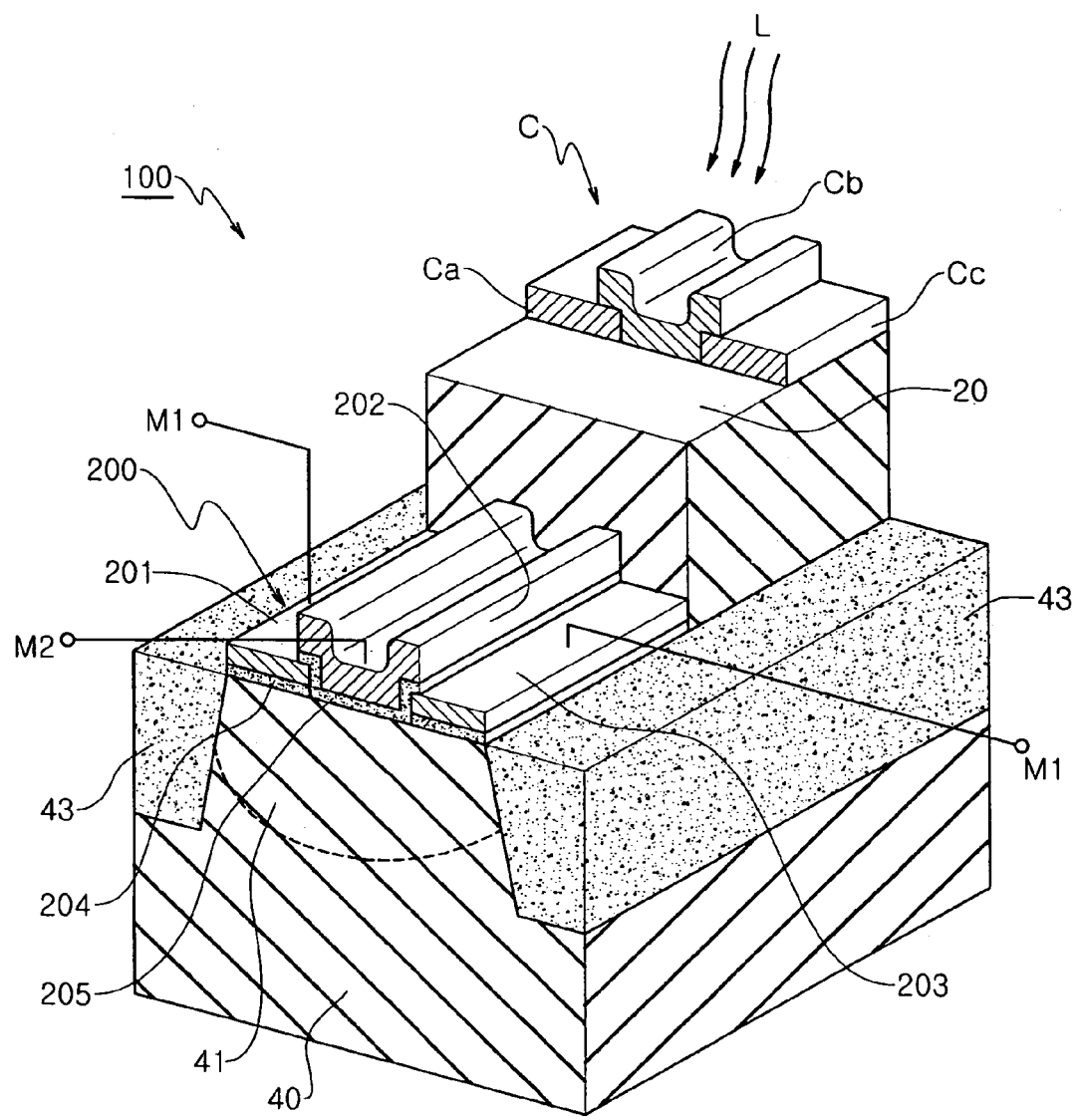
FIG. 3 is a schematic view showing a structure of unit color cell and photosensitive pixel unit consistent with embodiments of the present invention.

Meanwhile, as is shown in FIG. 3, consistent with another embodiment of the present invention, the first, second and third color patterns Cb, Ca and Cc constituting the unit color cell C may be serially arranged in a stripe type while being in close to one another so that the interfaces thereof may be overlapped. Under this circumstance, the second color pattern Ca may be placed at one side of the first color pattern Cb so that an interface therebetween can be overlapped, and the third color pattern Cc may be placed at the other side of the first color pattern Cb so that an interface therebetween may also be overlapped. In this embodiment, there is provided a construction in which the first color pattern Cb may naturally be interposed between the second and third color patterns Ca and Cc.

In a case that the first, second and third color patterns Cb, Ca and Cc constituting the unit color cell C may be serially arranged in a stripe type while being close enough to one another to overlap the interfaces thereof, the corresponding first, second and third color patterns Cb, Ca and Cc may obtain an effect that a contact length (or area) of the interface therebetween is maximized in an optimal state.

As mentioned above with the known system, since the unit color cells are constructed so that they are disposed in a mosaic type without a separate reinforcement, if a process for forming the additional unit color cells, for example, a deposition process of a photoresist, a patterning process of the photoresist, etc., is carelessly performed without a precautionary measures, a peeling may ensue such that the unit color cells are peeled off from the intermediate layer by a force applied during the corresponding process.

However, with embodiments consistent with the present invention, the first, second and third color patterns Cb, Ca and Cc constituting the unit color cell C may be serially arranged in a stripe type while being in close to one another so that the interfaces thereof can be overlapped, thus maximizing a contact length (or area) of the interface therebetween in optimal state and thus continuously maintaining inter-locking fixing structures. With this embodiment, even if a process for forming the additional unit color patterns, for example, a deposition process of a photoresist, a patterning process of the photoresist, etc., has been carelessly performed, a separate peeling may not result. Consequently, under an embodiment of the present invention, a finished color filter array CA may not suffer an unnecessary loss of color due to the peeling of the effective color pattern, even if the process is performed in a severe manner.

Meanwhile, as shown in FIG. 3, with the system of the image sensor 100 consistent with embodiments of the present invention, a photo sensitive pixel unit 200 may be disposed under the unit color cell C with an intermediate layer 20 interposed therebetween. The photo sensitive pixel unit 200 receives light having different colors which may be transmitted through the unit color cell C, individually produces photocharges, and selectively detects and individually outputs the photocharges produced by different colors.

In this embodiment, the photo sensitive pixel unit 200 may comprise a potential well 41 temporarily formed on, for example, an active region of a semiconductor substrate 40, and a first, second and third photo sensitive electrodes 202, 201 and 203 made of, for example, poly silicon material disposed on a predetermined portion of the potential well 41.

Second photo sensitive electrode 201 may be disposed at one side of first photo sensitive electrode 202 with an interface therebetween overlapping each other, and third photo sensitive electrode 203 may be disposed at the other side of first photo sensitive electrode 202 with an interface therebetween overlapping each other. In this embodiment, first photo sensitive electrode 202 may be naturally interposed between second and third photo sensitive electrodes 201 and 203, respectively.

The potential well 41 may be temporarily formed on the active region of semiconductor substrate 40 according to the input bias, so that it may receive light of green, red and blue colors transmitted through the first, second and third unit color patterns Cb, Ca and Cc to momentarily produce photocharges. The first photo sensitive electrode 202 may transfer light of first color, for example, green, transmitted through the first color pattern Cb, to the potential well 41, so as to induce photocharges to be produced in the potential well 41, and, when the photocharges corresponding to green light may be produced in the potential well 41, to draw up the corresponding photocharges thus to selectively transfer the same to a signal processing circuit, such as, for example, an interpolation circuit.

Also, second photo sensitive electrode 201 may transfer light of a second color, for example, red, transmitted through the second color pattern Ca, to potential well 41, so as to induce photocharges which may be produced in the potential well 41, and, when the photocharges corresponding to red light are produced in the potential well 41, to draw up the corresponding photocharges thus to selectively transfer the same to a signal processing circuit, such as, for example, an interpolation circuit.

Further, third photo sensitive electrode 203 may transfer light of third color, for example, blue, transmitted through the third color pattern Cc, to potential well 41, so as to induce photocharges to be produced in the potential well 41, and, when the photocharges corresponding to blue light are produced in the potential well 41, to draw up the corresponding photocharges thus to selectively transfer the same to a signal processing circuit, such as, for example, an interpolation circuit.

Hereinafter, processes for forming color image of the CMOS image sensor of embodiments consistent with the present invention constructed as previously mentioned will be described below.

First, when second and third photo sensitive electrodes 201 and 203 are simultaneously driven by applying bias voltage having, for example, positive potential, through a signal input line M1, potential well 41 which may be functioning as a depletion layer is momentarily and temporarily formed on the active region of semiconductor substrate 40 corresponding to the bottom faces of the second and third photo sensitive electrodes 201 and 203. At this time, to a signal input line M2 of the first photo sensitive electrode 202, bias voltage having, for example, negative potential, is applied, so that the potential wells 41 formed under second and third photo sensitive electrodes 201 and 203 are not influenced unnecessarily on an affection by first photo sensitive electrode 202.

Under this circumstance, when incident light from outside is transmitted through the second and third color patterns Ca and Cc is colored with red and blue, and reaches the active region of the semiconductor substrate 40, photocharges are produced and stored by potential wells 41 formed under the second and third photo sensitive electrodes 201 and 203.

Under the circumstance when a transistor, for example, a reset transistor, which may be formed on the active region of semiconductor substrate 40 and may be electrically connected with the second and third photo sensitive electrodes 201 and 203, is turned-on, second and third photo sensitive electrodes 201 and 203 draw up the photocharges produced and stored in the potential wells 41 and transfer the corresponding photocharges to a source follower formed on the active region of semiconductor substrate 40.

Then, the photocharges drawn up to the second and third photo sensitive electrodes 201 and 203 are amplified through source follower, and transferred to signal processing circuits, for example, an interpolation circuit, to assist an image production.

Meanwhile, in a state that the photocharges drawn up to second and third photo sensitive electrodes 201 and 203 have been transferred to the signal processing circuit through the above procedure, when bias voltage having, for example, positive potential, is applied through the signal input line M2, potential well 41 may be momentarily and temporarily formed on the active region of the semiconductor substrate 40 corresponding to the bottom portion of the first photo sensitive electrode 202. At this time, to the signal input line M1 of second and third photo sensitive electrodes 201 and 203, bias voltage having, for example, negative potential, is applied, so that potential well 41 formed under first photo sensitive electrodes 202 may not be influenced unnecessarily by second and third photo sensitive electrodes 201 and 203.

Under this embodiment, when incident light L is transmitted through the first color pattern Cb, is colored with green, and reaches the active region of the semiconductor substrate 40, photocharges may be produced and stored in the potential well 41 formed under the first photo sensitive electrode 202.

Under the circumstance, when the reset transistor, which may be formed on the active region of semiconductor substrate 40 and is electrically connected with the first photo sensitive electrode 202, is turned-on, first photo sensitive electrode 202 may draw up the photocharges produced and stored in potential well 41 and transfers the corresponding photocharges to a source follower formed on the active region of the semiconductor substrate 40.

Then, the photocharges drawn up to first photo sensitive electrode 202 may be amplified through source follower, and transferred to signal processing circuits, for example, an interpolation circuit, to assist an image production.

As described above, embodiments consistent with the present invention provides that various kinds of color information being processed at only one photo sensitive pixel unit 200 based on a unit color cell C having characteristic color patterns of the embodiments of the invention, so that a finished CMOS image sensor 100 can display so many colors, thus maximizing the resolution of image.

Hereinafter, a method for manufacturing a CMOS image sensor consistent with embodiments of the present invention having a driving manner as previously described will be described in detail below.

A method for manufacturing the CMOS image sensor may generally comprise the steps of: forming an isolating layer 43 in order to define an active region on a semiconductor substrate 40; depositing in turn a first insulating layer and a first conductive layer on the substrate 40; patterning the first insulating layer and the first conductive layer to form second and third photosensitive electrodes 201 and 203 to be spaced apart from each other; depositing in turn a second insulating layer and a second conductive layer in order to fill a space between second and third photosensitive electrodes 201 and 203 and forming a first photosensitive electrode 202; forming an intermediate layers 20 on first, second and third photosensitive electrodes 202, 201, and 203, respectively; forming second and third color patterns Ca and Cc spaced apart from each other at a predetermined interval on a predetermined region of a unit color cell on the respective pre-defined intermediate layer; and forming a first color pattern Cb in order to fill a space between the second and third color patterns Ca and Cc.

Figure 4:
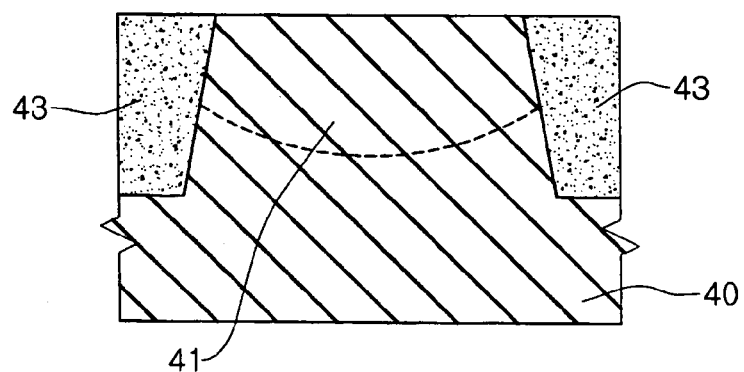
FIGS. 4 to 8 are cross-sectional views showing a process for manufacturing an image sensor consistent with embodiments of the present invention.

First, as is shown in FIG. 4, in another embodiment consistent with the present invention, isolating layer 43 of a field region for defining the active region of the semiconductor substrate 40 may be formed by selectively performing a Shallow Trench Isolation (STI) process or a Local Oxidation of Silicon (LOCOS) process, or other processes known to those skilled in the art. Herein, a P− type epitaxial layer (not shown) for increasing a dimension (or depth) of a potential well to be subsequently formed may be firstly formed on the semiconductor substrate 40, for example, the surface of the high concentration P++ type single crystal silicon substrate. Of course, according to the definition of the active region, a predetermined portion of the potential well 41 to be subsequently formed may also be defined naturally on a portion of semiconductor substrate 40.

Figure 5:
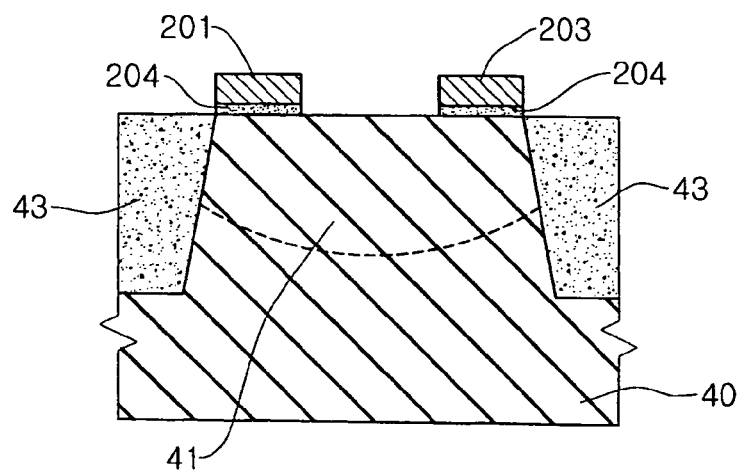

Then, as is shown in FIG. 5, using, for example, a low pressure chemical vapor deposition process, an electrode insulating layer 204 for the second and third photo sensitive electrodes 201 and 203 may be formed in a desired thickness on the predetermined portion of potential well 41. In this case, the electrode insulating layer 204 may be composed of a thermal oxide layer formed by, for example, a thermal oxidation process.

Then, using a low pressure chemical vapor deposition process, a conductive layer, for example, high concentration poly crystal silicon layer, for forming the second and third photo sensitive electrodes 201 and 203, may be formed in a desired thickness on the insulating layer 204. Of course, according to certain circumstances, a silicide layer may be additionally formed on the high concentration poly crystal silicon layer.

Then, by selectively performing a process for removing an unnecessary area through photolithography using a photoresist pattern (not shown), second and third photo sensitive electrodes 201 and 203 insulated by insulating layer 204 may be formed spaced apart from each other on the predetermined portion of potential well 41.

In this case, although it is not shown in the drawing, an elongated spacer may be additionally formed at both sides of the second and third photo sensitive electrodes 201 and 203.

Figure 6:
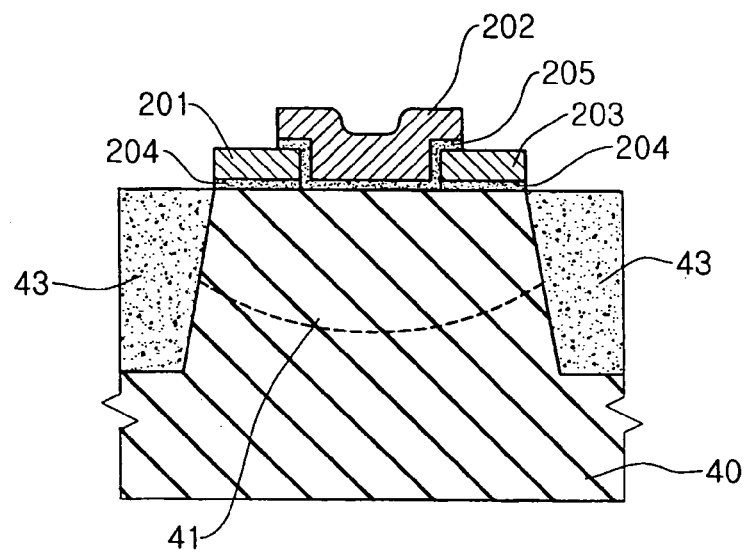

Then, as is shown in FIG. 6, using, for example, a low pressure chemical vapor deposition process, an electrode insulating layer 205 for the first photo sensitive electrode 202 may be formed in a desired thickness on the predetermined portion of potential well 41 including second and third photo sensitive electrodes 201 and 203. In this embodiment, electrode insulating layer 205 may be composed of a thermal oxide layer formed by, for example, a thermal oxidation process or any other process known to those of ordinary skill in the art.

Then, using the low pressure chemical vapor deposition process, a conductive layer, for example, high concentration poly crystal silicon layer, for forming first photo sensitive electrode 202 may be formed in a desired thickness on the insulating layer 205. Of course, according to certain circumstances, a silicide layer may be additionally formed on the high concentration poly crystal silicon layer.

Then, by selectively performing a process for removing a unnecessary area through a photolithography using a photoresist pattern, first photo sensitive electrode 202 may be formed in such a manner that it is disposed between second and third photo sensitive electrodes 201 and 203 with its interfaces between second and third photo sensitive electrodes 201 and 203 overlapping each other. Herein, first photo sensitive electrode 202 may be insulated from second and third photo sensitive electrodes 201 and 203, and semiconductor substrate 40, through the electrode insulating layer 205.

Of course, according to certain embodiments, an elongated spacer may be additionally formed at both sides of the first photo sensitive electrode 202.

Figure 7:
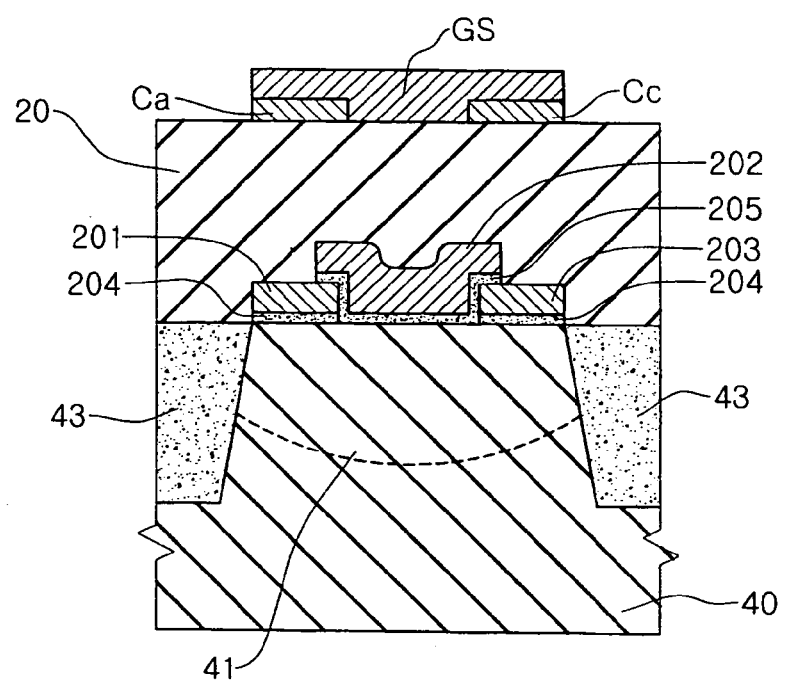

Then, as is shown in FIG. 7, for example, an intermediate layer 20, which may transfer lights having different colors transmitted through the unit color cell C to the photo sensitive pixel unit 200, is additionally formed by depositing an interlayer dielectric, an interconnect metal layer, a planarized layer, etc. Of course, the deposition structure and manner of the intermediate layer 20 may be modified under certain circumstances.

Meanwhile, when the intermediate layer 20 has been formed through the above processes, a photoresist for the second color pattern Ca may be formed in a desired thickness on a pre-defined portion of the intermediate layer 20, for example, on a portion corresponding to a formation position of the first, second and third photo sensitive electrodes 202, 201 and 203. Herein, the photoresist for the second color pattern Ca is pre-dyed with, for example, red, so that the second color pattern Ca can display red color.

Then, by performing a process for removing an unnecessary area by exposing and developing the photoresist through a photolithography, the second color pattern Ca having red color is formed on a portion of the predetermined area of the unit color cell C of intermediate layer 20.

Then, a photoresist for the third color pattern Cc may be formed in a desired thickness on the intermediate layer 20. In this case, the photoresist for the third color pattern Cc is also pre-dyed with, for example, blue, so that the third color pattern Cc can display blue color.

Then, by performing a process for removing a unnecessary area by exposing and developing the photoresist through a photolithography, the third color pattern Cc having red color and spaced apart from the second color pattern Ca may be formed on a portion of the predetermined area of the unit color cell C of the intermediate layer 20.

Then, a photoresist for the first color pattern Cb is formed in a desired thickness on the intermediate layer 20 including the second and third color patterns Ca and Cc. In this case, the photoresist for the first color pattern Cb may also be pre-dyed with, for example, green, so that the first color pattern Cb can display green color.

Figure 8:
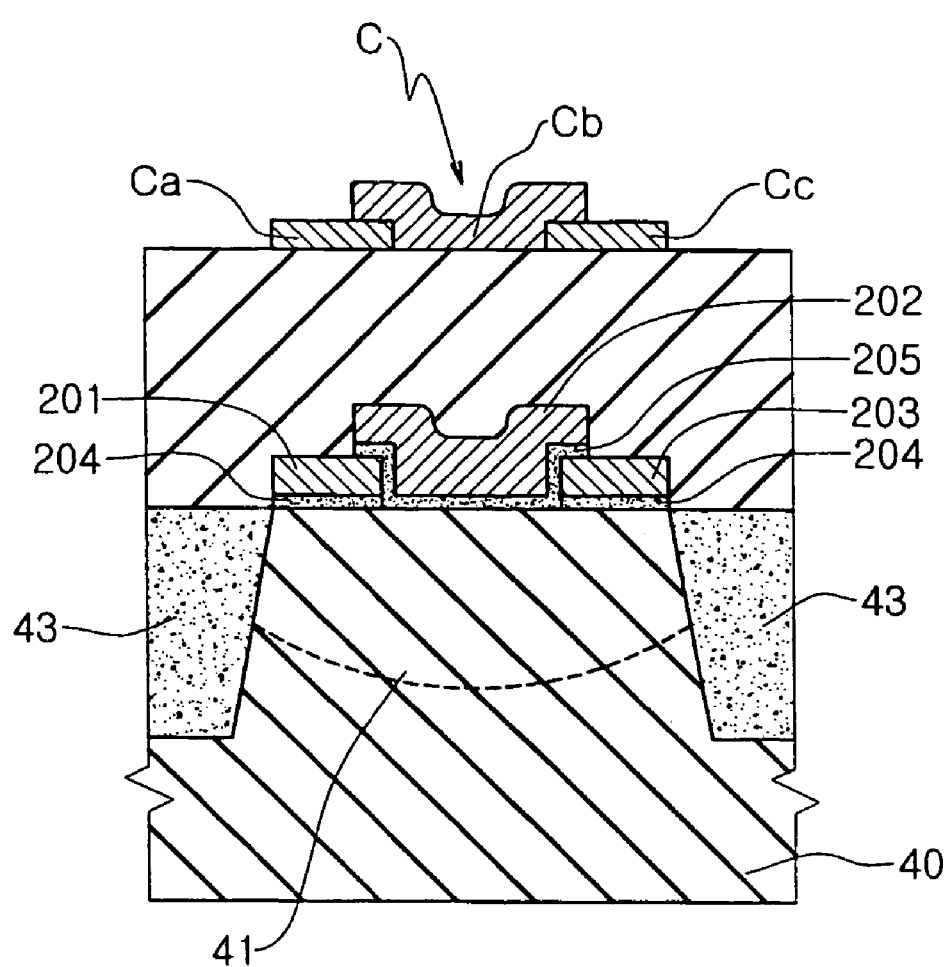

Then, by performing a process for removing a unnecessary area by exposing and developing the photoresist through a photolithography, as shown in FIG. 8, the first color pattern Cb is formed in such a manner that it is disposed between the second and third color patterns Ca and Cc with its interfaces between the second and third color patterns Ca and Cc overlapped each other.

As described above, an aspect of an embodiment consistent with the present invention is to improve shapes of respective unit color cells to closely form various color patterns, such as a red color pattern, a green color pattern and a blue color pattern, within each unit color cell in a stripe type, thereby to normally realize various colors such as red, green and blue required for image generation by itself without interdependence of the respective unit color cells, to induce a finally finished color filter array to smoothly express a more colors within a given condition, thereby to maintain resolution of a finally generated image in an optical state.

Also, embodiments of the present invention to closely form a plurality of color patterns, such as a red color pattern, a green color pattern and a blue color pattern, which maximize a contact length (or area) of each interface within each unit color cell in an optimal state, in a proper type, for example in a stripe type, and to allow the color patterns to continuously maintain an interdependently fixed structure within the respective unit color cells, thereby to induce a finally finished color filter array to be prevented form getting undesired damage of colors by peeling of effective color patterns after processes for additionally forming subsequent color patterns, such as a process for laminating photoresist, a process for patterning photoresist and so forth, are aggressively performed.

Although embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An image sensor, comprising:
   at least one unit color cell for colorizing incident light into different colors;
   at least one photosensitive pixel unit disposed on an active region of a semiconductor substrate for selectively sensing and individually outputting photocharges generated by passing through the unit color cell; and
   an intermediate layer for transmitting the different colors of light passing through the unit color cell to the photosensitive pixel unit,
   wherein the at least one photosensitive pixel unit corresponds to the at least one unit color cell.

2. The image sensor according to claim 1, wherein the photosensitive pixel unit comprises:
   a potential well temporarily formed on an active region of the semiconductor substrate according to an input bias for receiving light passing through the unit color cell to generate and accumulate photocharges;
   a first electrode disposed on the active region for transmitting the light passing through a first region of the unit color cell to generate the photocharges at the potential well;
   a second electrode disposed on the active region for transmitting the light passing through a second region of the unit color cell to generate the photocharges at the potential well; and
   a third electrode disposed on the active region for transmitting the light passing through a third region of the unit color cell to generate the photocharges at the potential well.

3. The image sensor according to claim 2, wherein the second and third electrodes are substantially simultaneously driven, and the first electrode is driven separately from the second and third electrodes.

4. The image sensor according to claim 1, wherein color patterns of red, green and blue are each formed by occupying a predetermined scale of individual occupation space within the unit color cell.

5. The image sensor according to claim 4, wherein the color patterns formed within the unit color cell are arranged in rows in a stripe type with interfaces between the color patterns in close contact so the color patterns overlap at the interfaces.

6. An image sensor, comprising:
   a unit color cell formed with color patterns of different colors;
   a photosensitive pixel unit disposed on an active region of a semiconductor substrate for selectively sensing and individually outputting photocharges generated by passing through the unit color cell; and
   an intermediate layer for transmitting the different colors of light passing through the unit color cell to the photosensitive pixel unit,
   wherein the photosensitive pixel unit senses the different colors.

7. The image sensor according to claim 6, wherein the photosensitive pixel unit comprises:
   a potential well temporarily formed on the active region of the semiconductor substrate according to an input bias for receiving light passing through the unit color cell to generate and accumulate photocharges;
   a first electrode disposed on the active region for transmitting the light passing through a first region of the unit color cell to generate the photocharges at the potential well;
   a second electrode disposed on the active region for transmitting the light passing through a second region of the unit color cell to generate the photocharges at the potential well; and
   a third electrode disposed on the active region for transmitting the light passing through a third region of the unit color cell to generate the photocharges at the potential well.

8. The image sensor according to claim 7, wherein the second and third electrodes are simultaneously driven, and the first electrode is driven separately from the second and third electrodes.

9. The image sensor according to claim 6, wherein the color patterns of red, green and blue are each formed by occupying a predetermined scale of individual occupation space within the unit color cell.

10. The image sensor according to claim 6, wherein the color patterns formed within the unit color cell are arranged in rows in a stripe type with interfaces between the color patterns in close contact so the color patterns overlap at the interfaces and wherein one color pattern overlaps with two color patterns.

11. An image sensor, comprising:
    a unit color cell formed with color patterns of different colors;
    a photosensitive pixel unit disposed on an active region of a semiconductor substrate; and
    an intermediate layer for transmitting the different colors of light passing through the unit color cell to the photosensitive pixel unit,
    wherein the photosensitive pixel unit includes a potential well having a plurality of regions and a plurality of electrodes transferring photocharges produced in the plurality of regions.

12. The image sensor according to claim 11, wherein one of the plurality of electrodes overlaps another of the plurality of electrodes.

* * * * *